United States Patent [19]

Weedon et al.

[11] Patent Number: 5,757,219

[45] Date of Patent: May 26, 1998

[54] APPARATUS FOR AND METHOD OF AUTOZEROING THE INPUT OF A CHARGE-TO-VOLTAGE CONVERTER

[75] Inventors: Hans Weedon, Salem; Roger Finch, Ipswich, both of Mass.

[73] Assignee: Analogic Corporation, Peabody, Mass.

[21] Appl. No.: 594,122

[22] Filed: Jan. 31, 1996

[51] Int. Cl.[6] ........................................... H03L 5/00
[52] U.S. Cl. .................. 327/307; 327/341; 327/96
[58] Field of Search ........................ 327/54, 73, 87, 327/95, 96, 103, 307, 341, 345

[56] References Cited

U.S. PATENT DOCUMENTS

| | | | |
|---|---|---|---|
| 4,031,504 | 6/1977 | Mioduski | 340/15.5 GC |
| 4,163,947 | 8/1979 | Weedon | 328/128 |
| 4,377,759 | 3/1983 | Ohhata et al. | 327/307 |
| 4,393,351 | 7/1983 | Gregorian et al. | 327/127 |
| 4,429,282 | 1/1984 | Saari | 330/9 |
| 4,430,622 | 2/1984 | Simoes | 327/307 |
| 4,578,646 | 3/1986 | Maio et al. | 327/307 |
| 4,587,443 | 5/1986 | Van De Plassche | 327/307 |
| 5,053,770 | 10/1991 | Mayer et al. | 341/118 |
| 5,276,367 | 1/1994 | Shibatani et al. | 307/494 |

*Primary Examiner*—Timothy P. Callahan
*Assistant Examiner*—Jung Ho Kim
*Attorney, Agent, or Firm*—Lappin & Kusmer LLP

[57] ABSTRACT

The invention is an autozero compensator for use in processing low level signals, the compensator comprising an input integrating operational amplifier providing at its output in one mode an error signal responsively to offset voltage across the differential input terminals of the amplifier. A second amplifier is provided in a feedback loop for generating from the error signal a charge at a compensating voltage equal and opposite to the offset voltage. That charge is capacitively stored and applied to the input amplifier to cancel the offset voltage.

13 Claims, 2 Drawing Sheets

1

APPARATUS FOR AND METHOD OF AUTOZEROING THE INPUT OF A CHARGE-TO-VOLTAGE CONVERTER

RELATED APPLICATIONS

This application is related to U.S. patent application Ser. No. 08/594,426 entitled Apparatus for and Method of Autozeroing the Output of a Charge-to-Voltage Converter, filed in the names of Enrico Dolazza, Hans Weedon and Roger Finch (Attorney's Docket No. ANA-52); U.S. patent application Ser. No. 08/594,424 entitled Continuous Self-Calibrating Data Acquisition System, filed in the names of Enrico Dolazza, and Roger Finch, (Attorney's Docket No. ANA-54); and U.S. patent application Ser. No. 08/594,425 entitled Reset Charge Compensation Circuit, filed in the names of Roger Finch, and Hans Weedon (Attorney's Docket No. ANA-67); all filed on the same day as the present application, and all incorporated herein by reference.

FIELD OF THE INVENTION

The present invention relates generally to an apparatus for autozeroing the input to a charge-to-voltage converter, and more particularly to such apparatus for use with input signals of very low amplitudes.

BACKGROUND OF THE INVENTION

While a number of autozeroing circuits are known and proven effective generally, such as those described in U.S. Pat. Nos. 4,163,947 and 5,053,770, their utility is seriously impaired when processing electrical signals of extremely low amplitude.

For example, digital or computed radiology is a known technique in which X-ray latent images are formed on a special substrate or plate rather than the usual X-ray film. In one form of computed radiology, the latent image is scanned with a laser and each image pixel is read out as an electrical charge. Computed radiology is superior to X-ray films for several reasons.

The substrate is typically erasable and reusable, while X-ray film is not. Secondly, physical examinations call for a predetermined level of X-ray energy, i.e., a peak voltage and maximum milliampere level for powering the X-ray source, and in the case of a pulsed X-ray source, the time duration of each pulse driving the pulsed X-ray source. If the parameters of the X-ray exposure are wrong the resulting X-ray image recorded on film tends to be either under or over exposed, because of the mismatch between the X-ray flux and the film dynamic range, resulting in poor diagnostic quality images.

Yet another advantage of computed radiology is that information derived from the latent image formed in the substrate intrinsically can be formed as a digital data file. The data is therefore easily stored in memory and archived, and more readily transferred than information contained in X-ray film, without deterioration of data. Thus, various digital processing algorithms and techniques become available making it easier to process the data, such as spatial filtering and other image enhancement techniques, and transfer the data from one location to another by any suitable means such as a network or modem.

A fourth advantage of computed radiology, at least with respect to certain substrate materials, is that the X-ray dosage can be reduced because the material used has a higher DQE than that of standard X-ray film.

In the U.S. the estimate of X-ray images recorded on film that are so poor as to require the retaking of the image ("recall") is estimated to be around 20%. Radiologists expect this number to go up, because of greater reliance on X-ray technicians who are typically less trained and often less skillful than the average radiologist. On the other hand, in computed radiology the signals representative of pixels of a latent image on a plate can be digitized over a sufficiently large dynamic range so that one should not have to retake the X-ray image.

In a certain implementation of computed radiology, an exposed X-ray plate is scanned, for example by a laser beam, and each pixel defined area of the plate is read over a time period of about 30 to 70 μsec to permit the full charge of the reading to be collected into a charge-to-voltage conversion device. The resulting voltages are then typically converted to digital format for storage, processing and display. Obviously, sequentially reading the typically millions of pixels for each plate into but a single information channel would be unduly time consuming. By using multiple (e.g., 64) channels or charge-to-voltage converters for reading the plate, and selectively processing the data signals from the plate through the respective channels, one can considerably reduce the time required to read the plate.

The amount of charge per pixel read out from computed radiology substrates tends to be quite small. For example, the amount of charge per pixel of a recently developed substrate is typically on the order of a few picocoloumbs full scale, e.g., less than about 5 or 6 picocoloumbs. Accurately and reliably reading this extremely small range of charges with a charge-to-voltage converter and digitizing the sensed signal with a full 16 bit dynamic range with presently designed charge-to-voltage converters is virtually impossible. In addition the process of measuring such small signals is extremely sensitive to noise. In fact, noise sources which are normally ignored in traditional designs must be either eliminated or compensated for to accurately measure the changes on each pixel.

In addition to reducing random noise, structured noise contributing to artifacts in the final image should also be reduced in such a system. One important source of structured noise in such a system is the noise associated with differences in channel characteristics (the input-output transfer function of the channel, defined by the offset and gain of the channel), typically due to varying component characteristics. Even high performance components perform within a given tolerance, and components in one channel typically have slightly different characteristics than corresponding components in the other channels. Each channel is typically dedicated to reading a fixed number of columns of image data, and therefore, differences between the channel characteristics tend to produce visual artifacts in the form of stripes in the image. Such noise can be termed "structured" noise (as compared with random noise) because it is inherent in the structure of the system and because it occurs repeatedly in each image produced by the system. To produce high quality images, it is important to reduce structured noise associated with such varying component characteristics.

Thus, where the charge-to-voltage converter comprises an integrator exemplified by a well-known integrating operational amplifier that periodically samples and integrates the input signals, it is important to be able to compensate for any offset voltage appearing at the input to the integrator prior to reading each pixel so that the effect of any offset voltage is minimized so as to minimize structured noise attributed to the offset voltage. Otherwise, the offset and gain of the amplifier may vary from reading to reading. In past designs, switches, typically in the form of field effect transistors (FETs), are used to reset or autozero the signal input of the integrating operational amplifier just prior to reading each pixel value. For example, in one prior art configuration the inverting input of the integrating operational amplifier, which is usually connected to receive data signals, is also connectable through an FET switch to system ground such that when the switch is closed the input is at ground, and when the switch is and, a sample is read. The amplifier maintains the input at virtual ground minimizing the offset voltage between the inverting and non-inverting inputs of the amplifier. Using this traditional approach for reading a radiology plate can cause problems. When the FET switch is closed so as to connect the input of the amplifier to system ground there is a parasitic capacitance on the order of 1 picofarad between the signal input to the operational amplifier and the radiology plate, and if one switches with 5 volts, then 5 picocoloumbs would be injected into the signal input to the integrating circuit. If the anticipated full scale signal is on the order of 5 or 6 picocoloumbs, which is the case when reading certain radiology plates, the error signal is clearly much too high.

Further, the value of the integrating capacitor of the integrator can vary with temperature. Reading of a computed radiology plate (as by laser scan) over a 30 second interval may encounter changes in temperature resulting in variations in the intensity of the latent image formed. A change of 1° or 2° C. in the temperature of the integrating capacitor, for example, will change the capacitance sufficiently to impair the accuracy of the output signal. Because the charge takes 20 to 30 μsecs to charge up the capacitor, it is also desirable to use multiple channels to reduce the overall time of processing. In such case, it is virtually impossible to match the output capacitance of all of the channels so that they are all the same.

OBJECTS OF THE INVENTION

Accordingly, it is a primary object of the present invention to provide an autozeroing circuit for use with an integrator for reading relatively low level signals.

Another object of the present invention is to provide in an information channel including an integrating operational amplifier, an autozeroing circuit for maintaining the offset voltage, $V_{off}$ of the amplifier as close as possible to zero.

And another object of the present invention is to provide apparatus for autozeroing the input of each of a plurality of data channels of a data acquisition system.

Still another object of the present invention is to provide apparatus for setting the offset voltage $V_{off}$ at the input of the integrator to zero for each such channel of a data acquisition system.

Yet another object of the present invention is to provide an autozeroing circuit for use with the data channels of a data acquisition system that permits one to make reliable measurements of extremely low level data signals such as provided by a computed radiology plate.

And still another object of the present invention to provide an autozeroing circuit for use with data channels of a data acquisition system that allows calibration of all of the channels so as to correct for any offset or gain among the various channels.

SUMMARY OF THE INVENTION

To effect the foregoing and other objects, the present invention generally comprises an autozero compensator circuit for an information channel of a data acquisition system including an integrating operational amplifier having inverting and non-inverting input terminals and an output terminal. The autozero compensator circuit comprises means for selectively bypassing the integrating capacitor of the integrating amplifier so as provide at the amplifier's output terminal the offset voltage present at the inverting input terminal. From that offset voltage, a compensating voltage, equal and opposite to the offset voltage is derived and stored. Means are included for applying the compensating voltage to the non-inverting input terminal during measurement of charge from the computed radiology plate, thereby nulling the offset voltage.

Preferably during the time that data signals are not being fed to the input amplifier, the channel is calibrated for gain and any offset. The circuit is then reset (autozeroed) by generating and storing the compensating signal for the next reading or measurement.

BRIEF DESCRIPTION OF THE DRAWINGS

For a fuller understanding of the nature and objects of the present invention, reference should be had to the following detailed description taken in connection with the accompanying drawings wherein.

DETAILED DESCRIPTION OF THE DRAWINGS

Figure 1:
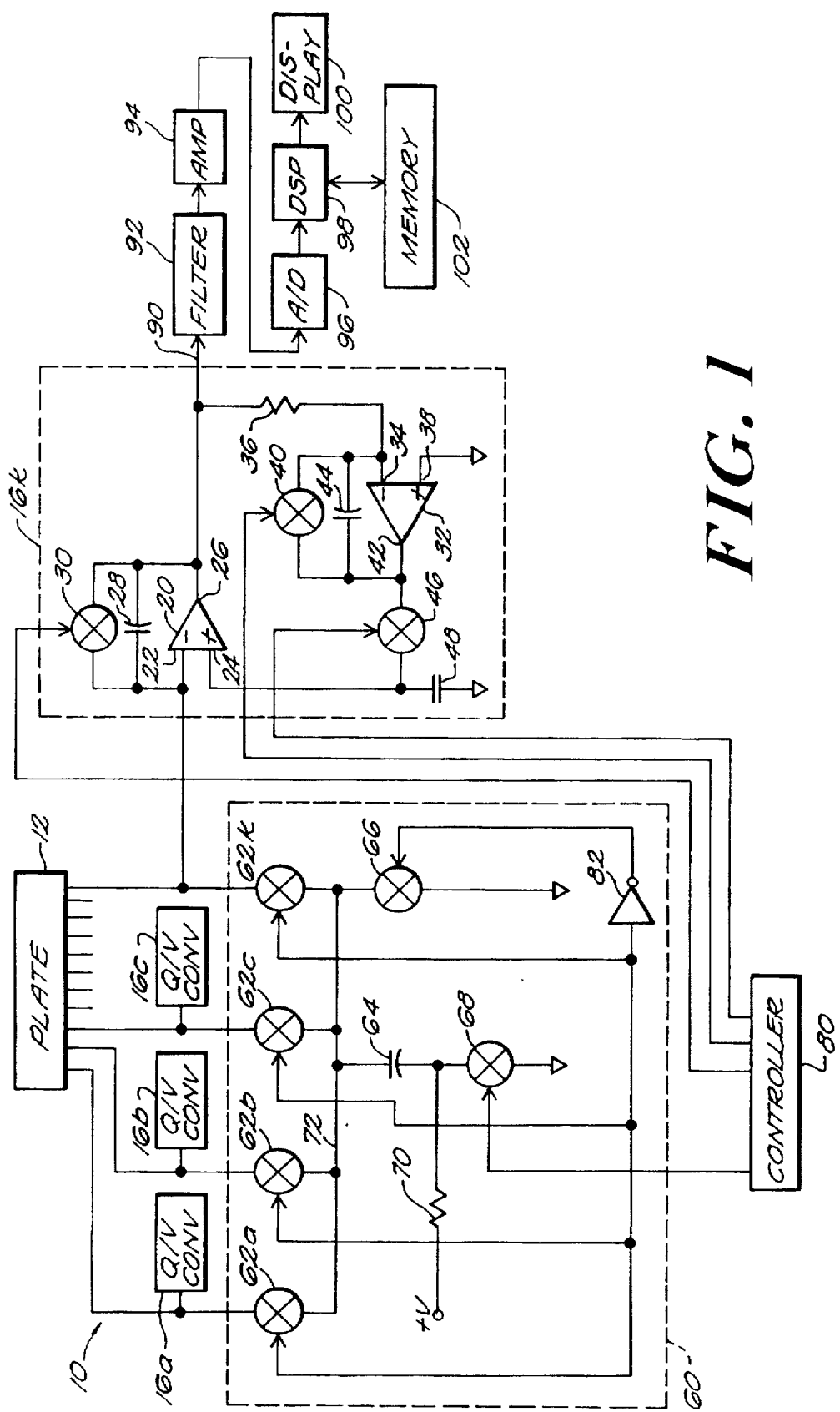
FIG. 1 is a partial schematic and partial block diagram illustrating a data acquisition system for reading the output of a computed radiology plate through multiple data or formation channels, with each channel including an integrator modified to include an autozeroing circuit constructed according to the principles of the present invention.

As shown in FIG. 1, a computed radiology plate 12 when exposed to an X-ray image will record the image as a latent image in an array of pixels. A data acquisition system 10 is adapted to read the image data output of computed radiology plate 12 (when the latter is scanned, for example, by a laser) so that the image data is read pixel by pixel through a plurality of data acquisition channels, the number of which can vary depending on such factors as the total number of pixels of the plate 12 that are required to be read, the speed at which the data can be integrated and read and the overall desired cost of the system. The outputs of plate 12 thus form multiple data or information channels adapted to receive charge readings from selected pixels as they are selectively scanned by a laser all in a preselected sequence during the reading of the plate. The number of channels are indicated herein as N, N being any integer, for example, 64. Each of the channels preferably includes its own charge-to-voltage converter 16a–16k modified to include an autozeroing circuit constructed according to the principles of the present invention. In FIG. 1, the charge-to-voltage converter or integrator 16k forming part of the data or information channel K is shown in detail as an example of each of the channels of the preferred embodiment. Such an integrator is exemplified by a well-known integrating operational amplifier 20 having the usual inverting input terminal 22, non-inverting input terminal 24, output terminal 26 and integrating capacitor 28 connected in a negative feedback path between terminals 26 and 22. The autozero circuit of the present invention includes reset switch 30, preferably an FET, connected in parallel to capacitor 28.

To the extent described above it will be appreciated that a finite offset voltage, $V_{off}$ present across terminals 22 and 24 will provide an error signal at output terminal 26. In accordance with the teachings of the present invention, means are provided for deriving from that error signal a compensating voltage equal and opposite to the offset voltage, i.e. $-V_{off}$, and for storing the latter so that it can be subsequently used to null the offset voltage during the time of measurement of a charge from the plate 12. To this end, the present invention includes differential amplifier 32, inverting input terminal 34 of which is connected through resistor 36 to output terminal 26 of amplifier 20, non-inverting input terminal 38 of amplifier 32 being connected to system ground. Reset switch 40 is connected between inverting input terminal 34 and output terminal 42 of amplifier 32 in parallel with capacitor 44. Output terminal 42, in turn is connected through another switch 46 to non-inverting input 24 of amplifier 20. Lastly, the junction connecting terminal 24 and the output terminal of switch 46 is connected through storage capacitor 48 to system ground. It will be apparent that amplifier 20 is connected in a feedback loop of amplifier 32 between terminals 34 and 42 of amplifier 32, when the switch 46 is closed.

A calibration source 60 includes a switch 62 for each of the channels, wherein each switch has one side connected to a corresponding output of plate 12 and its other side connected to a common bus 72 connected to the other switches. The bus 72, in turn, is connected to a common calibration capacitor $C_{cal}$, indicated at 64, and a common switch 66. The latter, in turn, is connected to system ground. The capacitor 64 is also, in turn, connected through a switch 68 to system ground. A DC regulated voltage supply V biases a resistor 70 that is connected to the junction between capacitor 64 and switch 68.

A controller 80 is used to selectively control the timing and operation of switches 30, 40 and 46 of each channel, and each of the switches 62, 66 and 68 of the calibration source 60. Controller 80 can be an appropriately programmed digital computer, processor, or the like. With regard to switch 66, the latter is connected to controller 80 through inverter 82 so that the switch 66 is operated in antiphase with switches 62. Thus, when any one of the switches 62 is closed, switch 66 is open. When the calibration circuit is not in use the switches 62 are all opened while switch 66 is closed, connecting the bus 72 to ground so as to keep spurious charge from the bus 72. As described more fully hereinafter, switches 62 are operated in sequence so that only one charge-to-voltage converter 16 is connected to the calibration source 60 at a time, each at a time when no measurements are being taken through the corresponding channel. Preferably, the output of each converter, indicated at 90, is connected to a filter 92, which in turn is connected to the input of an amplifier 94. The output of amplifier 94 is connected to the input of an A/D converter 96 so as to digitize the analog signal output of the amplifier. The digital signal output of converter 96, in turn, is processed by digital signal processing circuitry, indicated generally at 98. The circuitry 98 includes suitable memory means 102, such as read only memory (ROM), as well as an output adapted to be connected to display means 100. Display means 100 may be, for example, a printer or a computer screen for displaying the image provided by the plate 12 based upon the data received, or alternatively a network or modem for transmitting the data to a remote site. Components 92, 94, 96, 98, 100 and 102 may be shared by all of the information channels by sequential timing of the processing of signals from the channels through the components, via a multiplexing arrangement (not shown), or alternatively, each channel may contain its own set of post processing components, such as filter 92, filter 94, A/D converter 96, DSP 98 and memory 102.

In operation, converter 16$k$ and calibration source 60 of FIG. 1 work in response to signals received from controller 80. It will be apparent that each channel is repeatedly calibrated, preferably periodically before each data measurement or a predetermined series of data measurements, so that correction is provided to correct for errors attributed to $V_{off}$ and differences in channel gain. The calibration mode is accomplished in two stages.

Prior to the beginning of the first stage of the calibration mode of channel K switch 62$k$ is opened and switches 66 and 68 are both closed so that there is no spurious charge on the bus 72 and both plates of the capacitor 64 are grounded. Thus, there is no input charge from either the plate 12 nor the calibration circuit 60.

Next, during the first stage of the calibration mode, the compensation voltage $-V_{off}$ is generated and stored on capacitor 48. During the initiation of the first stage, plate 12 is coupled to inverting input 22 of amplifier 20; however, the laser beam of the laser used to read the plate 12 is not incident on any of the pixels of plate 12 that are connected to channel K during the period of calibration of the channel K so no pixel charge is transferred to the channel from the plate. Initially, switch 62$k$ is opened to decouple the calibration circuit 60 from the channel. Switch 30 is then closed so that the latter provides a short circuit between the inverting input 22 and the output 26 of amplifier 20 so that any $V_{off}$ will appear at the output terminal 26. This signal is applied to the inverting input 34 of amplifier 32. Switch 40 is opened and switch 46 is closed so that amplifier 32 functions as an inverter, such that after stabilization, its output becomes $-V_{off}$. The latter signal is applied through the closed switch 46 to the capacitor 48. Switch 46 is then opened so that the signal, which is substantially equal and opposite to $V_{off}$, is now stored on capacitor 48. With the switch 46 open, the capacitor 48 is isolated from the amplifier 32 so that the voltage across the capacitor is applied as a correction voltage to the non-inverting input 24 of the amplifier 20 where it serves to null or autozero the offset at terminal 22 during the second stage of the calibration mode as well as during the measurement mode.

Next, with switch 30 remaining closed, switch 40 is next closed so as to clear the capacitors 28 and 44, i.e., any charge on one side of a capacitor is transferred to the other side, and to protect the respective amplifier. Otherwise, amplifier 32 might start at a high voltage (saturation) when initiating each calibration mode. In this regard capacitor 44 is required in order to prevent oscillations during the calibration mode, and to reduce gain at high frequencies and thus minimize oscillation at those frequencies.

To the extent described it will be apparent from the foregoing that the circuit shown in FIG. 1 allows one to null the offset voltage $V_{off}$ so that the input for each channel is independent of $V_{off}$. Thus, the resulting effective offset voltage is zero. It should be recognized that amplifier 32 also has an offset. Accordingly, amplifier 32 is selected to have a very high gain so as to minimize its own offset.

Specifically, the output of amplifier 32 equals:

$$-V_{off} + \epsilon/G, \qquad (1)$$

wherein $\epsilon$ is the offset voltage of amplifier 32 and G is its gain.

It will be apparent that with large gain G, the contribution of ε is negligible. For example, if $-V_{off}$ for amplifier 32 is on the order of 10 μvolts and the gain is $10^5$, the error will be $10^{-10}$ volts. Preferably, the error should be kept below 0.5 μvolts, and the error of 10 picovolts estimated above is well below that.

There are two reasons for wanting to set the effective offset voltage $V_{off}$ to zero, the first relating to the significant errors contributed by the offset voltage in view of the very low level signals being measured as described above and below, and the second relating to the fact that the offset and gain of each integrator can be different for each channel, both creating inaccuracies in the collected data.

Accordingly, during the next stage of the calibration mode, two signals representative of the gain of the channel are generated as taught in co-pending application U.S. patent application Ser. No. 08/594,424 entitled Continuous Self-Calibrating Data Acquisition System, filed in the name of Enrico Dolazza, and Roger Finch (Attorney's Docket No. ANA-54).

More specifically, by compensating for the offset output voltage for zero charge input, and by measuring the voltage output for a known input charge $Q_c$, and by assuming the gain is linear through the dynamic range of measurement of charge, one can use these values to compensate for one important source of error for system 10, caused by the variance in the transfer characteristics or functions of each of the N channels. Due to differences in performance of the devices used in the channels, such as amplifier 20 and capacitor 28, the transfer characteristics of each channel can be slightly different from other channels. The variance in the input-output transfer characteristics between the channels is typically very small, but since the input signals to the channels are also anticipated to be very small, the variance becomes an important source of error.

Figure 2:
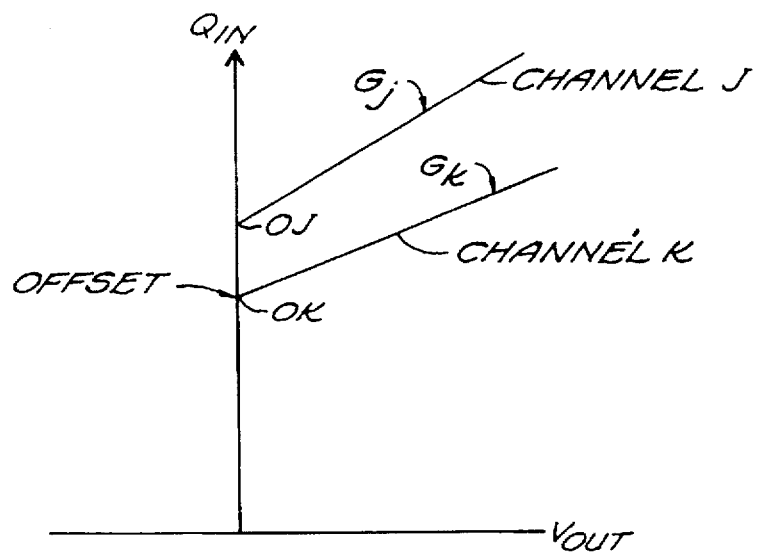
FIG. 2 is a graphical plot showing a typical transfer function for two data channels having two different offsets and gains before correction is applied to the data channels.

As seen in FIG. 2, assuming that each channel behaves linearly, the input-output transfer characteristic or function of each channel can be characterized by an offset and a gain. The system 10 provides means for characterizing the input-output transfer characteristic of each of the N channels by determining each channel's associated offset and gain. The system uses the measured offsets and gains to substantially reduce or eliminate the error associated with differences among the input-output transfer characteristics of the channels.

As described in co-pending application U.S. patent application Ser. No. 08/594,424 entitled Continuous Self-Calibrating Data Acquisition System, filed in the name of Enrico Dolazza, and Roger Finch (Attorney's Docket No. ANA-54), the offset and gain of each channel is preferably determined by measuring the outputs in response to known inputs, with the outputs being converted to digital signals by converter 96 so that they can be further processed in the digital domain by processor 98, although it should be appreciated the two outputs can be processed using analog circuitry to achieve the same result. As previously described, the offset of each channel is preferably measured by making one of the known input values received at input 22 of amplifier 20 from the plate 12 (without any charge read out), and generating and storing the offset compensation voltage $-V_{off}$ on capacitor 48. Once $V_{off}$ is generated and stored on capacitor 48, the gain is determined by measuring the output of each channel for two known inputs, (a) one input being provided at the input 22 from the calibration circuit 60 with the input 22 connected to system ground through the calibration circuit (and the input 24 connected to receive the compensation voltage $-V_{off}$ so that the output is substantially zero), and (b) the other input being equal to $Q_c$ and applied to the input 22 from the calibration circuit 60 (with the offset compensation $-V_{off}$ being provided at the input 24). The two known inputs to the input 22 of amplifier can therefore be provided by the calibration circuit 60, with the compensation voltage $-V_{off}$ being provided by the capacitor 48.

The process of generating the two inputs for measuring the gain of channel K will now be discussed. The first measurement of the gain is made by measuring the output of the channel K under the following conditions: the laser beam is not incident on any of the pixels of plate 12 connected to the channel; and as usual, the plate 12 is coupled to the inverting input 22 of amplifier 20; switch 62k is closed to couple the channel K to the calibration circuitry 60; switch 68 is closed to prevent any current from the voltage source V from being transferred to the channel; and switch 66 is closed so as to connect the inverting input 22 of amplifier 20 to system ground. At this point in time, the compensation signal $-V_{off}$ is applied to the non-inverting input 24 and with zero input from the plate 12 and the input 22 to the charge to voltage converter being coupled to the calibration circuitry 60, the output of channel K, which is herein referred to as the offset $C_{kO}$, is measured (as shown in the graph illustrated in FIG. 3), by measuring the output of the analog to digital converter 96. The digital output of converter 96 is stored in memory 102. Again, ideally $C_{kO}$ is zero due to the compensating voltage $-V_{off}$, but due to the characteristics of the components used, $C_{kO}$ may be different from the earlier measured value with the calibration circuitry 60 disconnected from the channel K.

Calibration circuitry 60 is then operated as described above to inject the known charge $Q_c$ into channel K. After charge injection, that is, after switches 66 and 68 have been open for a predetermined period of time $T_c$ which is the same during each calibration), controller 80 closes switches 66 and 68 to prevent any further injection of charge, and the voltage output of the channel K is measured at the output of the analog to digital converter 96. This output is designated $C_{kc}$ which herein refers to the voltage output of channel K after the charge injection Of $Q_{kc}$. The quantity $(C_{kc}-C_{kO})$, the difference between the two measured voltage outputs is then determined by processor 98, divided by the difference between the two inputs corresponding to the two outputs, $(Q_{kc}-Q_{kO})$, so as to provide a value of gain, the latter being stored in memory 102 so as to provide the value of gain for the channel K in memory for subsequent use. Switch 62k is then opened to decouple the channel K from the calibration circuitry and switches 66 and 68 closed to reset the capacitor 64 for the next calibration operation.

Figure 3:
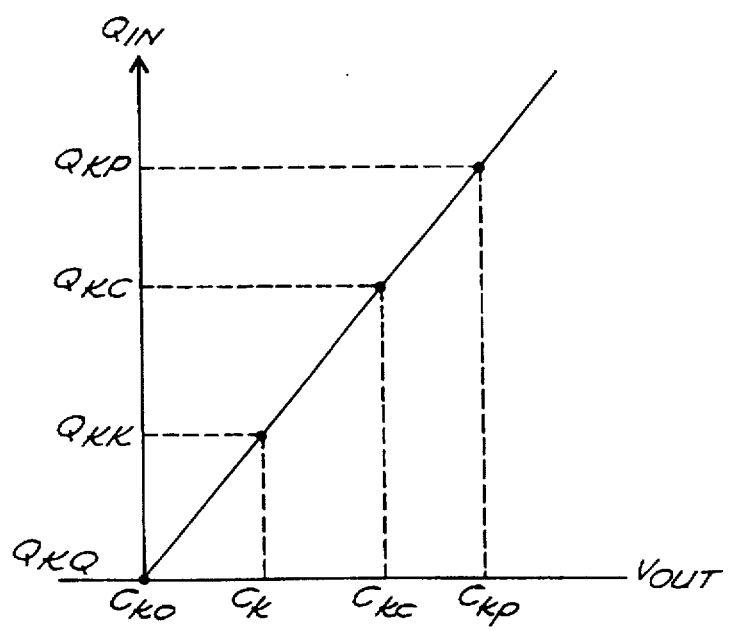
FIG. 3 is a graphical plot showing the determination of the transfer function of each channel so at the output of the channel can be determined independently of the offset and gain of the channel.

Referring to FIG. 3, the two points $(Q_{kO}, C_{kO})$ and $(Q_{kc}, C_{kc})$ represent the two measurements. Assuming the channel is linear, the gain of the channel is equal to the slope of the line connecting the two measured points $$\left( \frac{\Delta V out}{\Delta Q in} \right).$$

As shown in FIG. 3, the slope of this line, designated $\alpha_k$, is given by the following equation (2).

$$\alpha_k = \frac{C_{kc} - C_{kO}}{Q_{kc}}$$

As will be discussed in further detail below, the gain may be calculated by measuring the two quantities $C_{kc}$ and $C_{kO}$, and the quantity $Q_{kc}$ need not be precisely measured so long as the potential V and the charging period $T_c$ remain constant.

Since the input-output transfer function of each channel is assumed to be linear, the values of the offset, $V_{off}$ and the previously determined gain, $\alpha_k$, fully characterize channel K. As shown in FIG. 3, the input-output transfer function of channel K is linear and has a slope $\alpha_k$ and a Y-intercept of $Q_{k0}$ equal to zero, or near zero. It should be noted that, in accordance with the teachings of U.S. patent application Ser. No. 08/594,424 (Attorney's Docket No. ANA-54), the offset was measured with the calibration circuitry decoupled from the channel, and the quantity $(C_{kc}-C_{k0})$, which is necessary for calculating the gain, was measured with the calibration circuitry coupled to the channel. Although the offset voltage can vary depending on whether the channel is coupled to the calibration circuitry, the gain of the channel is believed to be independent of whether the channel is coupled to the calibration circuitry. Therefore, these measured values accurately characterize the channel.

When image data is being read from plate 12, it is desirable to measure the latent charge $Q_{kp}$ stored on each pixel. However, this charge is not measured directly and is instead calculated in terms of the voltage output $C_{kp}$ of the A/D converter 96 after the pixel p has been coupled to the channel for the appropriate integration interval and the charge on the pixel has been discharged by exposure to the laser beam of laser 12. As can be seen from FIG. 3, the actual measured charge $Q_{kp}$ can be calculated according to following equation (3):

$$Q_{kp} = \frac{C_{kp} - \text{Offset}}{C_{kc} - C_{k0}} Q_{kc} \qquad (3)$$

With the application of $-V_{off}$ equation (3) becomes:

$$Q_{kp} = \frac{C_{kp}}{C_{kc} - C_{k0}} Q_{kc}$$

It should be appreciated that by using the stored offset and gain values for each channel, and determining the measured charge $Q_{kp}$ from each voltage output as a function of the stored offset and gain values, the values of Q, such as $Q_p$, measured by each of the channels are normalized so as to be independent of the actual gain and offset of the channel. The determined values of Q are therefore more accurate than if the assumption were made that the offset and gain were the same for all of the channels.

A system for calculating $Q_p$ as a function of equation (3) is shown and described in pending application, U.S. patent application Ser. No. 08/594,424 (Attorney's Docket No. ANA-54).

In summation, the circuit of the present invention allows calibration for a multichannel data acquisition system so that all of the channels can operate consistently with respect to one another. The device operates in two modes. During a calibration mode (1) a correction voltage equal and opposite to the offset of the integrator is memorized on the capacitor 48, and (2) with the resulting effective offset being equal to zero the gain is determined for each channel. During a measurement mode, the stored value of $-V_{off}$ is applied to the non-inverting input of amplifier 20 so as to null the offset voltage at the input of amplifier 20, enabling the latter to measure relatively low level signals, and the feedback path through amplifier 32 is disabled.

Amplifier 20 is preferably designed with a fast slew rate so that it can quickly process data, while feedback amplifier 32 can be much slower so as to accurately calibrate the circuit. The time constant for the feedback circuit to stabilize is typically 5 μF times 30Ω or about 150 microseconds. The operation of the circuit is such that calibration can occur every 1 millisecond or so.

Since certain changes may be made in the above apparatus without departing from the scope of the invention herein involved, it is intended that all matter contained in the above description or shown in the accompanying drawings shall be interpreted in an illustrative and not in a limiting sense.

What is claimed is:

1. In an information channel including an integrating operational amplifier having inverting and non-inverting input terminals, an output terminal and an integrating capacitor connected between said inverting input terminal and said output terminal, an autozero compensator circuit comprising:

means for selectively bypassing the integrating capacitor of said integrating amplifier so as to provide at said output terminal an output voltage equal to an offset voltage present at said inverting input terminal;

means for deriving from said output voltage, a compensating voltage, substantially equal and opposite to said offset voltage; and means for applying said compensating voltage to said non-inverting input terminal so as to compensate for said offset voltage.

2. An autozero compensator circuit as defined in claim 1, further including means for storing said compensating voltage; and means for applying said compensating voltage to said non-inverting input terminal from said means for storing.

3. An autozero compensator circuit as defined in claim 2, wherein said means for storing comprises a storage capacitor connected between ground and said non-inverting input terminal; and said means for selectively bypassing comprises first switching means.

4. An autozero compensator circuit as defined in claim 3, wherein said means for deriving comprises:

a very high-gain differential amplifier having inverting and non-inverting input terminals and an output terminal; and second switching means for selectively connecting the output terminal of said differential amplifier to both the non-inverting input terminal of said first operational amplifier and to said storage capacitor.

5. An autozero compensator circuit as defined in claim 4, wherein the gain of said differential amplifier is selected so that the effect of the offset voltage of said differential amplifier at the output terminal thereof is negligible.

6. An autozero compensator circuit as defined in claim 4, wherein the slew rate of said operational amplifier is substantially higher than that of said differential amplifier.

7. An autozero compensator circuit as defined in claim 4, wherein said switching means are all FET switches.

8. An autozero compensator circuit as defined in claim 4, including a capacitance connected between said inverting input and output terminals of said differential amplifier for reducing the gain of the latter at high frequencies.

9. An autozero compensator circuit as defined in claim 8, including switching means for bypassing said capacitance.

10. An autozero compensator circuit as defined in claim 8, including means for introducing a known electrical charge into said inverting terminal of said operational amplifier so as to determine the gain thereof.

11. An autozero compensator circuit as defined in claim 10, wherein said means for introducing comprises a resistor one side of which is connected to a voltage source, and third switching means for selectively connecting the other side of said resistor to said inverting terminal of said operational amplifier.

12. A method of autozeroing a charge-to-voltage converter comprising an integrating operational amplifier having inverting and non-inverting input terminals and an output terminal and including means for selectively connecting and disconnecting said inverting input terminal and output terminal to one another so as to provide at said output terminal an output signal equal to any offset voltage present at said inverting input terminal, said method comprising the steps of:

deriving from said output signal a compensating voltage substantially equal and opposite to said offset voltage, and applying said compensating voltage to said non-inverting input terminal so as to compensate for said offset voltage.

13. A method of calibrating an information channel containing a charge-to-voltage converter comprising an integrating operational amplifier, said method comprising the steps of:

deriving from an output signal including an offset voltage a compensating voltage substantially equal and opposite to said offset voltage;

applying said compensating voltage to said non-inverting input terminal so as to compensate for said offset voltage; and introducing a known electrical charge into the inverting terminal of said operational amplifier so as to determine the gain of said operational amplifier.

* * * * *